(12) United States Patent
Bosch et al.

(10) Patent No.: US 6,452,254 B2
(45) Date of Patent: Sep. 17, 2002

(54) OPTICAL PACKAGE WITH DUAL INTERCONNECT CAPABILITY

(75) Inventors: Fridolin Ludwig Bosch, Bethlehem; Hui Fu; James Kevin Plourde, both of Allentown, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/808,654

(22) Filed: Mar. 15, 2001

Related U.S. Application Data

(60) Provisional application No. 60/200,981, filed on May 1, 2000.

(51) Int. Cl.⁷ ............................................. H01L 29/40
(52) U.S. Cl. ...................... 257/664; 257/690; 257/692; 257/693
(58) Field of Search ................. 257/378, 664, 257/690, 692, 693, 698, 735, 773, 775, 528, 532, 533, 691

(56) References Cited

U.S. PATENT DOCUMENTS

| | | | | |
|---|---|---|---|---|
| 4,631,805 A | * | 12/1986 | Olsen et al. | 29/827 |
| 4,862,344 A | * | 8/1989 | Emoto | 363/146 |
| 5,977,631 A | * | 11/1999 | Notani | 257/728 |
| 6,307,272 B1 | * | 10/2001 | Takahashi et al. | 257/666 |

* cited by examiner

*Primary Examiner*—Nathan J. Flynn
*Assistant Examiner*—Pershelle L Greene
(74) *Attorney, Agent, or Firm*—Duane Morris LLP; Joseph F. Oriti

(57) ABSTRACT

An electronic package is adapted to be coupled in a single-ended configuration and in a differential configuration. The package provides a characteristic impedance of approximately 50 ohms when configured in a single-ended mode and also when configured in the differential mode. The package includes multiple terminals, which are coupled to ground, S, and S̄. The package may be configured externally by the user for either mode. The package may also be fabricated to be coupled in either the differential mode or single-ended mode for user specific applications.

14 Claims, 11 Drawing Sheets

OPTICAL PACKAGE WITH DUAL INTERCONNECT CAPABILITY

CROSS REFERENCES TO RELATED APPLICATIONS

This nonprovisional U.S. national application, filed under 35 U.S.C. §111(a), claims under 35 U.S.C. §119(e)(1), the benefit of the filing date of provisional U.S. national application Ser. No. 60/200981, filed under 35 U.S.C. § 111(b) on May 1, 2000, the teachings of which are incorporated herein by reference.

FIELD OF THE INVENTION

This invention relates to electronic packages, and particularly to a package having a dual interconnect capability.

BACKGROUND

Typical electronic packages are configured for either differential mode or for single-ended mode operation. Thus, if the electronic circuit requires a desired signal to be provided in differential mode, one type of electronic package is applicable. If the electronic circuit requires the desired signal to be provided in single-ended mode, another type of electronic package is applicable.

A differential mode signal is obtained by the algebraic difference of two signals. These two signals are typically referred to as S and $\overline{S}$ (S bar). S and $\overline{S}$ are 180 degrees out of phase. Further, differential mode signals often contain an unwanted common mode signal component. This unwanted common mode component is often caused by interference sensed by both of the conductors carrying S and $\overline{S}$. Typical applications of differential mode circuits, require an impedance match for low reflection. Thus, electronic packages designed for differential mode applications are capable of being coupled to S and $\overline{S}$, suppressing the common mode signal, and providing a characteristic impedance match, which is usually 50 ohms. As referenced herein and well understood in the art, characteristic impedance is with respect to ground. Differential mode circuits typically are used with integrated circuits, whereas singled-ended mode circuits are typically used with the higher frequencies associated with optical or microwave systems.

Single-ended mode signals are typically measured with respect to ground. A majority of circuits requiring desired signals to be provided in a single-ended configuration, require a 50-ohm characteristic impedance. Thus, typical electronic packages configured for single-ended mode provide a signal terminal, a ground terminal, and a characteristic impedance of 50 ohms.

Disadvantages of having separate packages for single-ended and differential configurations include, additional costs and time associated with manufacturing, testing, and production equipment. These costs are typically passed to the user/consumer. Further a user designing a system requiring both single-ended and differential mode circuits, must design its systems to interface with at least two types of packages, thus increasing system cost by requiring more complicated circuit board layout and system interfaces. Thus, a need exists for an electronic package, which is applicable to both single-ended and differential configurations.

SUMMARY OF THE INVENTION

An electronic package is adapted to be coupled in a single-ended configuration and in a differential configuration. The electronic package includes two adjacent terminals adapted to be coupled to a first signal and a second signal, respectively.

BRIEF DESCRIPTION OF THE DRAWINGS

The invention is best understood from the following detailed description when read in connection with the accompanying drawing. The various features of the drawings may not be to scale. Included in the drawing are the following figures.

DETAILED DESCRIPTION

Figure 1A:
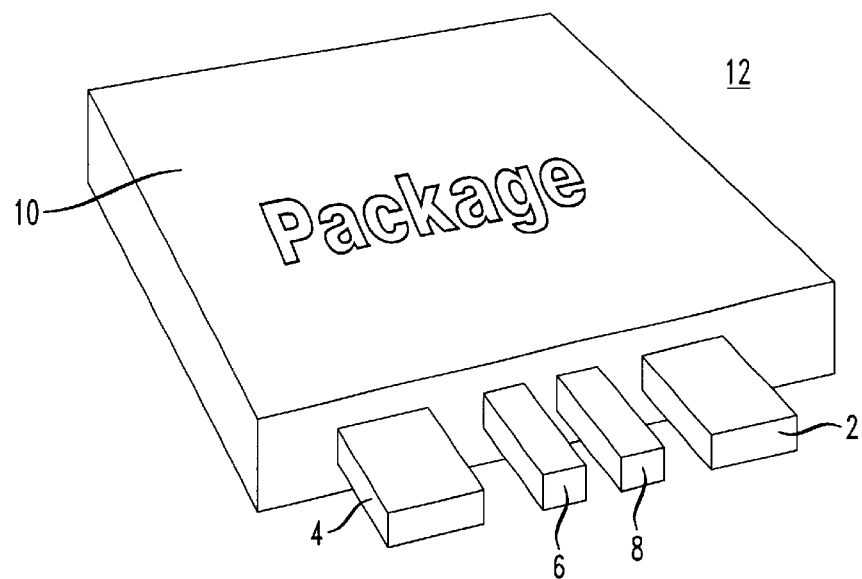
FIG. 1A is a perspective view of an electronic package in accordance with an exemplary embodiment of the present invention.
Figure 1B:
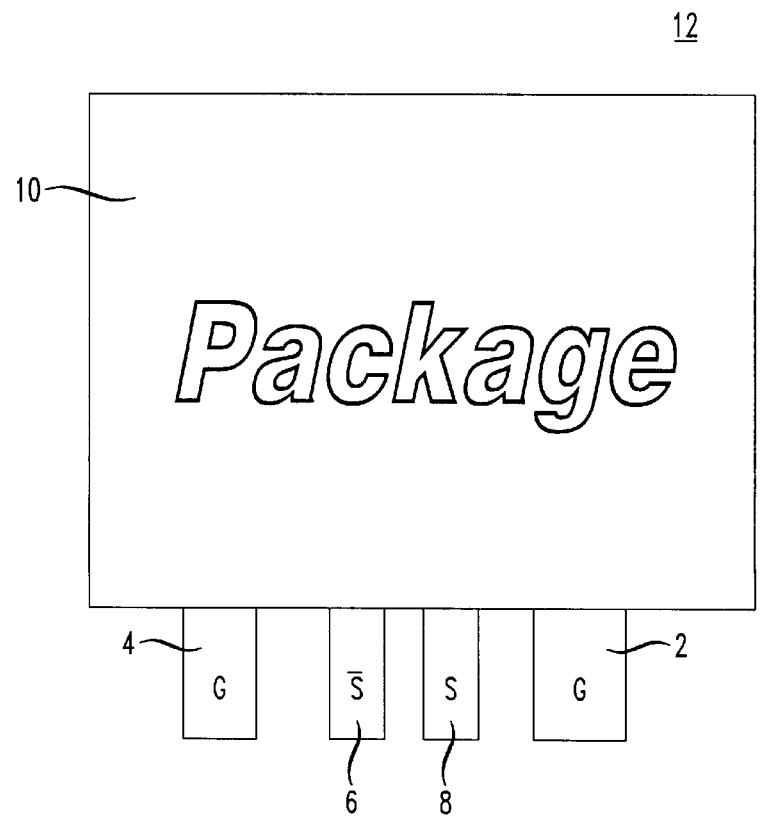
FIG. 1B is a top view of the package in FIG. 1A.

FIG. 1A is a perspective view of an electronic package in accordance with an exemplary embodiment of the present invention. FIG. 1B is a top view of the package in FIG. 1A. An electronic package, as described herein, comprises optical circuitry, electronic circuitry, or any combination therein. The electronic package, generally designated 12, comprises housing 10 and terminals 2, 4, 6, and 8. Housing 10 may comprise components such as transmitters, receivers, integrated circuits (ICs) and hybrid integrated circuits (HICs). Terminals 2, 4, 6, and 8 are capable of being coupled to circuitry external to the housing 10 (external circuitry not shown). This external circuitry may be, for example, telecommunications circuitry. Terminals 2 and 4 are adapted to be coupled to ground (G). Terminal 8 is adapted to be coupled to a signal (S) and terminal 6 is adapted to be coupled to an inverted signal, commonly referred to as S bar ($\overline{S}$). $\overline{S}$ is a signal, which is 180° out of phase with S. In an alternate embodiment of the invention, terminal 6 is adapted to be coupled to S and terminal 8 is adapted to be coupled to $\overline{S}$. Terminals 6 and 8 are adjacent to each other. Neither of ground terminals 2 or 4 is positioned between terminals 6 and 8. Package 12 may be coupled to external circuitry in either a single-ended configuration or a differential configuration. The electronic package 12 provides a 50-ohm to ground characteristic impedance in a single-ended configuration and a 50-ohm characteristic impedance in a differential configuration.

Figure 2:
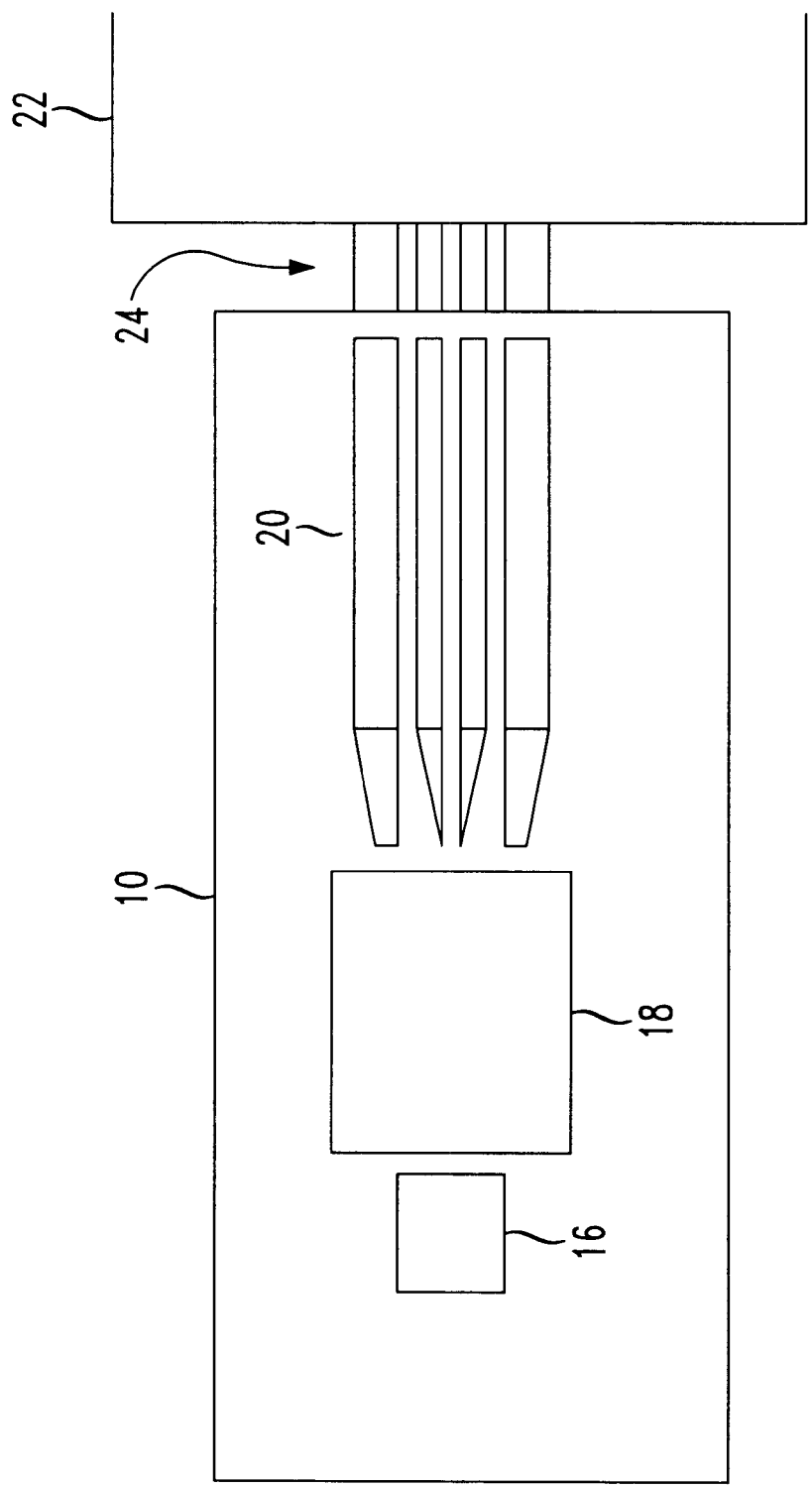
FIG. 2 is a functional block diagram of an exemplary package in accordance with the present invention.

FIG. 2 is a functional block diagram of an exemplary package in accordance with the present invention. Housing 10 comprises transmission lines 20, integrated circuit portion 18, and optical circuit 16. Coupling of optical circuit 16 to integrated circuit portion 18, and integrated circuit portion 18 to transmission lines 20 may be by any appropriate means, such as wire bonding or solder (coupling not shown). Optical circuit 16 may be any appropriate optical circuit such as a detector, amplifier, isolator, or transmitter. In the exemplary block diagram shown in FIG. 2, optical circuitry 16 is a detector portion of an optical receiver. Thus, an optical signal is received by detector 16 from, for example, an optical fiber (fiber not shown), and is transmitted to external circuitry 22 through integrated circuit portion 18, transmission lines 20, and terminals 2, 4, 6, and 8 (terminals 2, 4, 6, and 8 are generally designated 24 in FIG. 2). Integrated portion 18 couples the signal to the transmission lines 20, provides appropriate impedance matching and gain, and provides hermeticity, if desired. Coupling to the external circuitry 22 may be in a single-ended configuration or a differential configuration. A coupling circuit (coupling circuit not shown in FIG. 2) in accordance with the present invention coupled to the transmission lines 20 and the terminals 24 facilitates coupling in a single-ended or differential configuration. Configuring package 12 in either a single-ended or differential configuration may be accomplished within housing 10 or external to housing 10, or a combination thereof.

Figure 3:
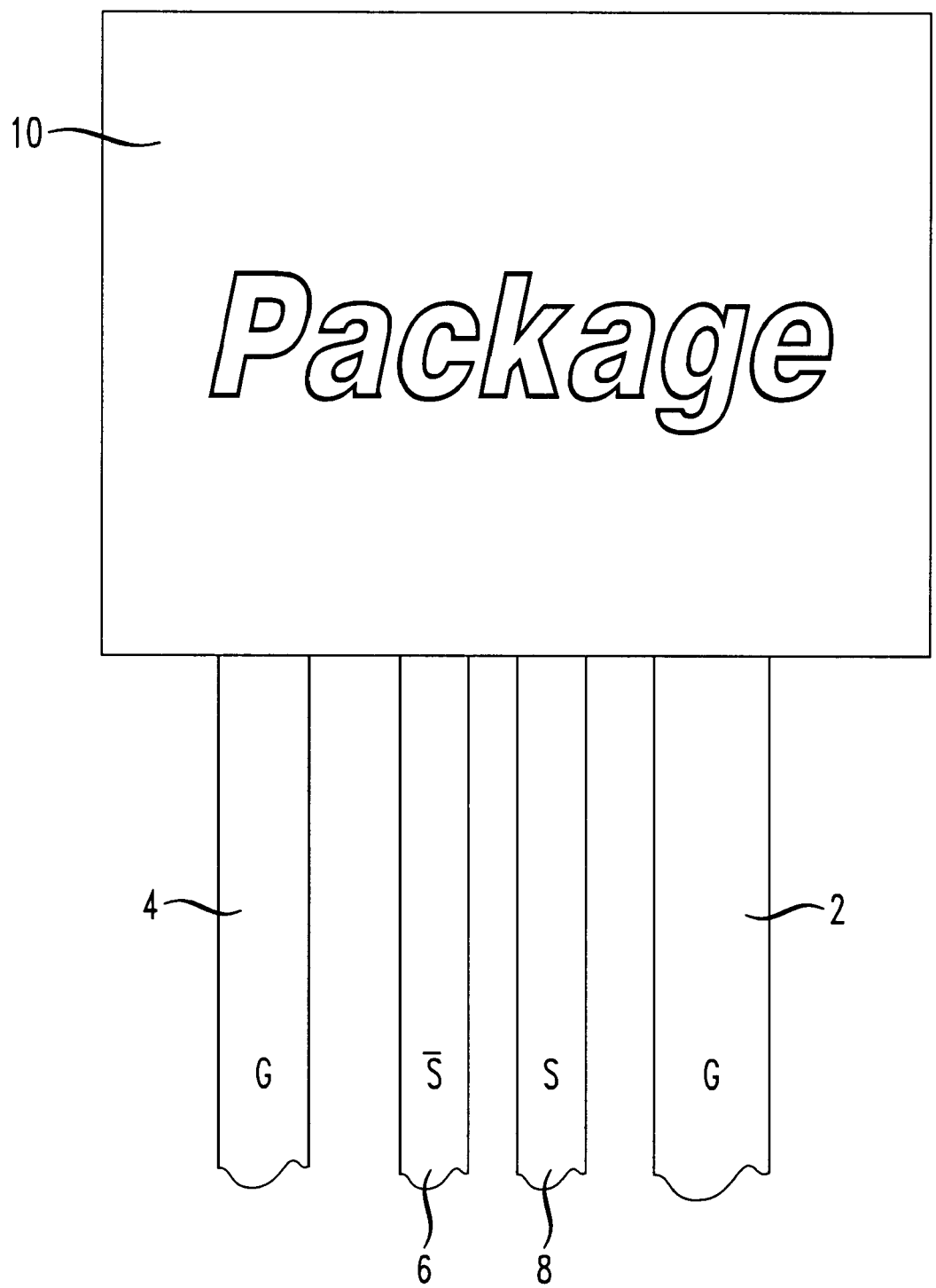
FIG. 3 is a top view of an exemplary electronic package adapted to be coupled in a differential configuration, in accordance with the present invention.

FIG. 3 is a top view of an exemplary electronic package adapted to be coupled in a differential configuration, in accordance with the present invention. In a differential configuration, terminals 8 and 6 (S and $\overline{S}$, respectively) are coupled to external circuitry. Terminals 2 (G) and 4 (G) are not required in a purely differential configuration. Terminals 2 (G) and 4 (G) may be terminated or coupled to external circuitry for other reasons. Package 12 provides a characteristic impedance of approximately 50 ohms per line in the differential configuration shown in FIG. 3.

Figure 4:
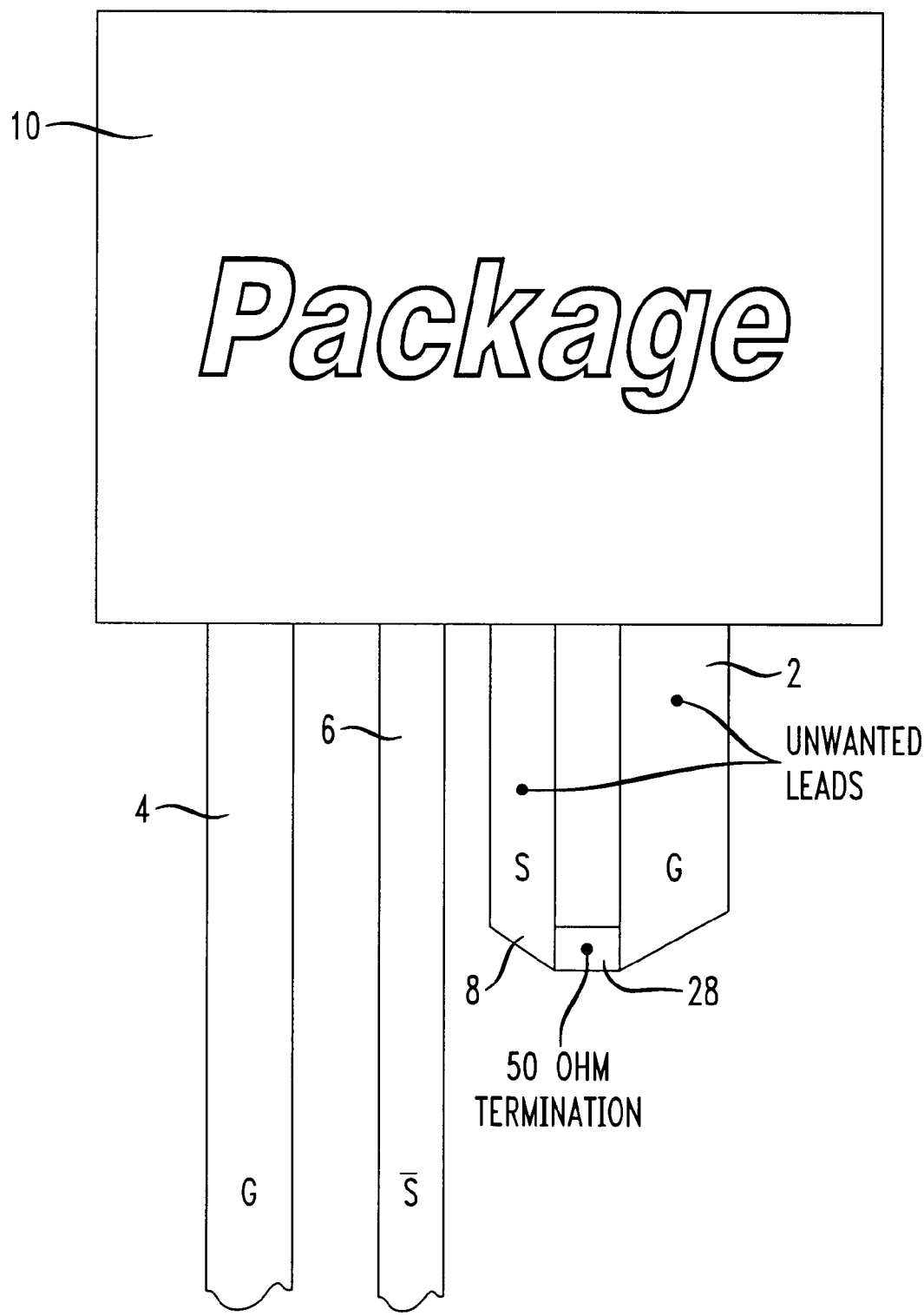
FIG. 4 is a top view of an exemplary electronic package adapted to be coupled in a single-ended configuration by external coupling.

FIG. 4 is a top view of an exemplary electronic package adapted to be coupled in a single-ended configuration by external coupling, in accordance with the present invention. In a single-ended configuration, a desired signal is obtained from either of terminals 8 or 6 (S or $\overline{S}$. respectively) with respect to ground. Thus, a desired single-ended signal is obtainable between terminals 6 ($\overline{S}$) and 4 (G), or 8 (S) and 2 (G). Further, the desired signal may be provided by either terminal 6 or 8 with respect to ground, wherein ground is provided by terminals 4 and 2 coupled together. FIG. 4 shows terminals 4 and 6 adapted to be coupled to external circuitry (external circuitry not shown). In a signal-ended configuration, the pair of terminals that are not used to provide the desired signal, is terminated in any manner well known in the art. Thus, in FIG. 4, the desired signal is provided by terminals 4 (G) and 6 ($\overline{S}$). Terminals 2 and 8 are terminated by 50-ohm termination 28.

In another embodiment of the invention, the desired signal is provided by terminals 2 and 8, and terminals 4 and 6 are terminated by a 50-ohm termination. The various combinations of coupling of terminals 2, 4, 6, and 8 may also be accomplished internal to housing 10 (e.g., 50-ohm termination 28 may be coupled inside housing 10). Internal coupling may be accomplished by coupling transmission lines 20 within integrated circuit portion 18. Internal coupling is accomplished by the electronic package 12 being fabricated with the appropriate coupling. External coupling does not require specific coupling to be fabricated into the electronic package 12. Thus, an advantage of external coupling, is that a single fabrication design is suitable for all variations of single-ended and differential coupling applications. Electronic package 12 provides a characteristic impedance of approximately 50 ohms when coupled in a single-ended configuration.

Figure 5A:
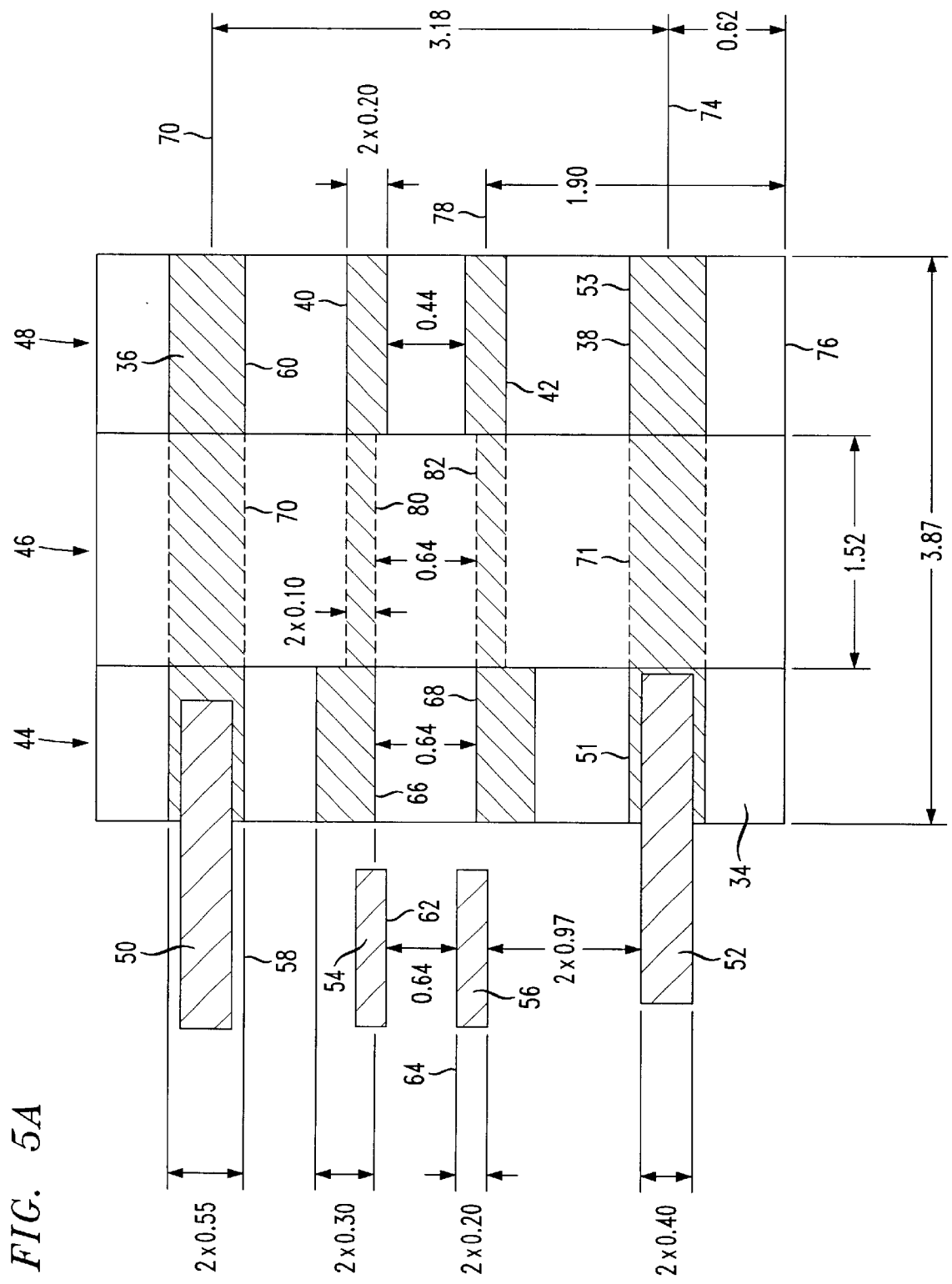
FIG. 5A is a top view of an exemplary coupling circuit in accordance with the present invention.
Figure 5B:
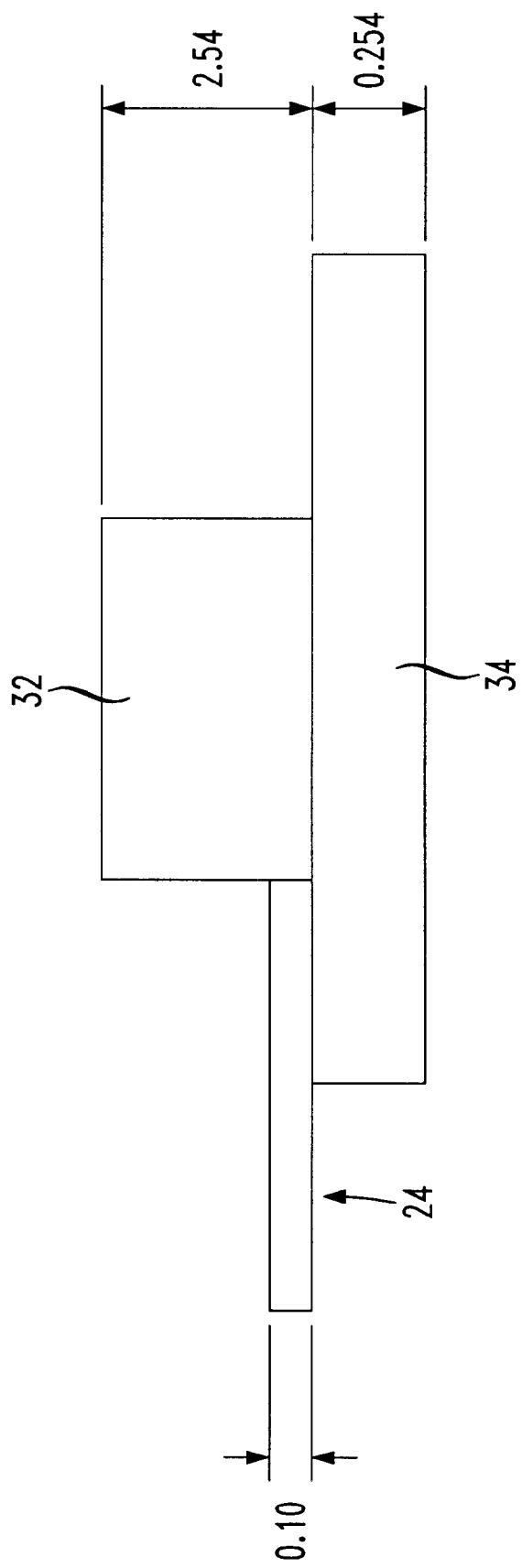
FIG. 5B is a side view of FIG. 5A.

FIG. 5A is a top view of a coupling circuit positioned at the housing wall of the package in accordance with the present invention. FIG. 5B is a side view of FIG. 5A. The coupling circuit shown in FIGS. 5A and 5B is positioned between transmission lines 20 and terminals 24 (see FIG. 2). All labeled dimensions in FIGS. 5A and 5B are in millimeters (mm). In FIG. 5B, each of terminals 24 (i.e., terminals 2, 4, 6, and 8) are approximately 0.10 mm in height. Substrate 34 is approximately 0.254 mm in height. In an exemplary embodiment of the invention substrate 34 is alumina. Substrate 34 may comprise any material (e.g., metalized ceramic) having a dielectric constant approximately equal to the dielectric constant of alumina. The dielectric constant and height of substrate 34 along with the width and spacing of the metalized lines help maintain the capacitances to achieve a characteristic impedance of approximately 50 ohms. Upper layer 32 is approximately 2.54 mm in height. In an exemplary embodiment of the invention, upper layer 32 is alumina. Upper layer 32 may comprise any material (e.g., metalized ceramic) having a dielectric constant approximately equal to the dielectric constant of alumina. As shown in FIG. 5A, the length of upper layer 32 is approximately 1.52 mm and the length of substrate 34 is approximately 3.87 mm.

In FIG. 5A, portions 44 and 48 represent surface areas of substrate 34, which are not in direct contact with (covered by) by upper layer 32. Portion 44 is adapted to be coupled to terminals 24 and portion 48 is adapted to be coupled to transmission lines 20 (see FIG. 2). Portion 46 represents the surface area of substrate 34 that is in direct contact with (covered by) upper layer 32. Conductive strips 36 and 38 provide a conductive path for ground signals between transmission lines 20 and terminals 2 and 4 (see FIG. 2). The width of each of conductive strips 36 and 38 is approximately 0.55 mm. This width is indicated in FIG. 5A by the indicator "2×0.55." The "2" indicates that the dimension 0.55 mm applies to two elements, in this case, conductive strips 36 and 38. This width remains approximately constant through portions 44, 46, and 48. The spacing between centerline 72 of conductive 36 and centerline 74 of conductive strip 38 is approximately 3.18 mm. The spacing between centerline 74 of conductive strip 38 and edge 76 of substrate 34 is approximately 0.62 mm. The width of and spacing between conductive strips 36 and 38, helps maintain the capacitances to achieve approximately 50-ohm characteristic impedance.

In one embodiment of the invention, terminals 50 and 52 represent terminals 2 and 4, respectively. In another embodiment of the invention, terminals 50 and 52 represent terminals 4 and 2, respectively. As indicated in FIG. 5A, the width of each of terminals 50 and 52 is approximately 0.40 mm. Terminals 50 and 52 are coupled to conductive strips 36 and 38, respectively, by any appropriate electrically conductive means (e.g., solder, wire bond). Terminal 50 is coupled to conductive strip 36 such that it is centered on conductive strip 36 in area 44, and the edge 58 of conductive strip 36 is aligned with the edges 60 and 70 of conductive strip 36. Terminal 52 is coupled to conductive strip 38 such that it is centered on conductive strip 38 in area 44, and the edge 51 of terminal 38 is aligned with the edges 53 and 71 of conductive strip 38. These alignments help maintain the appropriate capacitance to achieve a characteristic impedance of approximately 50 ohms.

Conductive strips 40 and 42 provide a conductive path for signals S and $\overline{S}$. In one embodiment of the invention, conductive strips 40 and 42 provide a conductive path for signals S and $\overline{S}$. respectively. In another embodiment of the invention, conductive strips 40 and 42 provide a conductive path for signals S and $\overline{S}$, respectively. The width of the segments of each of conductive strips 40 and 42 on surface area 48, is approximately 0.20 mm. This corresponds to the segments of conductive strips 40 and 42 that are adapted for coupling to transmission lines 20. This width of each of conductive strips 40 and 42 on surface area 46 is approximately 0.10 mm. This corresponds to the segments of conductive strips 40 and 42 that are positioned between substrate 34 and upper layer 32. The width of each of conductive strips 40 and 42 on surface area 44 is approximately 0.30 mm. The spacing between the aforementioned three segments of conductive strips 40 and 42 is such that on surface area 48, the spacing is approximately 0.44 mm, on surface are 46, the spacing is approximately 0.64 mm, and on surface area 44 the spacing is approximately 0.64 mm. The spacing between centerline 78 of the segment of conductive strip 42 on surface area 48 and edge 76 of substrate 34 is approximately 1.90 mm. Edge 66 of the segment of conductive strip 40 on surface area 44 is aligned with edge 80 of the segment of conductive strip 40 on surface area 46. Edge 68 of the segment of conductive strip 42 on surface area 44 is aligned with edge 82 of the segment of conductive strip 42 on surface area 46. The width of and spacing between each segment of conductive strips 40 and 42, and the alignment of edges 80, 66, 82, and 68, are chosen to help maintain the appropriate capacitances to achieve a characteristic impedance of approximately 50 ohms.

Terminals 54 and 56 represent terminals 6 and 8. In one embodiment of the invention, terminals 54 and 56 represent terminals 6 and 8, respectively. In another embodiment of the invention, terminals 54 and 56 represent terminals 8 and 6, respectively. Terminals 54 and 56 are coupled to conductive strips 40 and 42 respectively by any appropriate electrically conductive means (e.g., solder, wire bond). In FIG. 5A, terminals 54 and 56 are offset to the left of conductive strips 40 and 42 for the sake of clarity. Terminal 54 is coupled to conductive strip 40 such that it is centered on conductive strip 40 in area 44 and is spaced 0.44 mm from terminal 56 and spaced 0.97 mm from terminal 50. Terminal 56 is coupled to conductive strip 42 such that it is centered on conductive strip 42 in area 44 and is spaced 0.97 mm from terminal 52. This alignment helps maintain the appropriate capacitances to achieve a characteristic impedance of approximately 50 ohms, and requires that terminals 54 and 56 be splayed.

Figure 6:
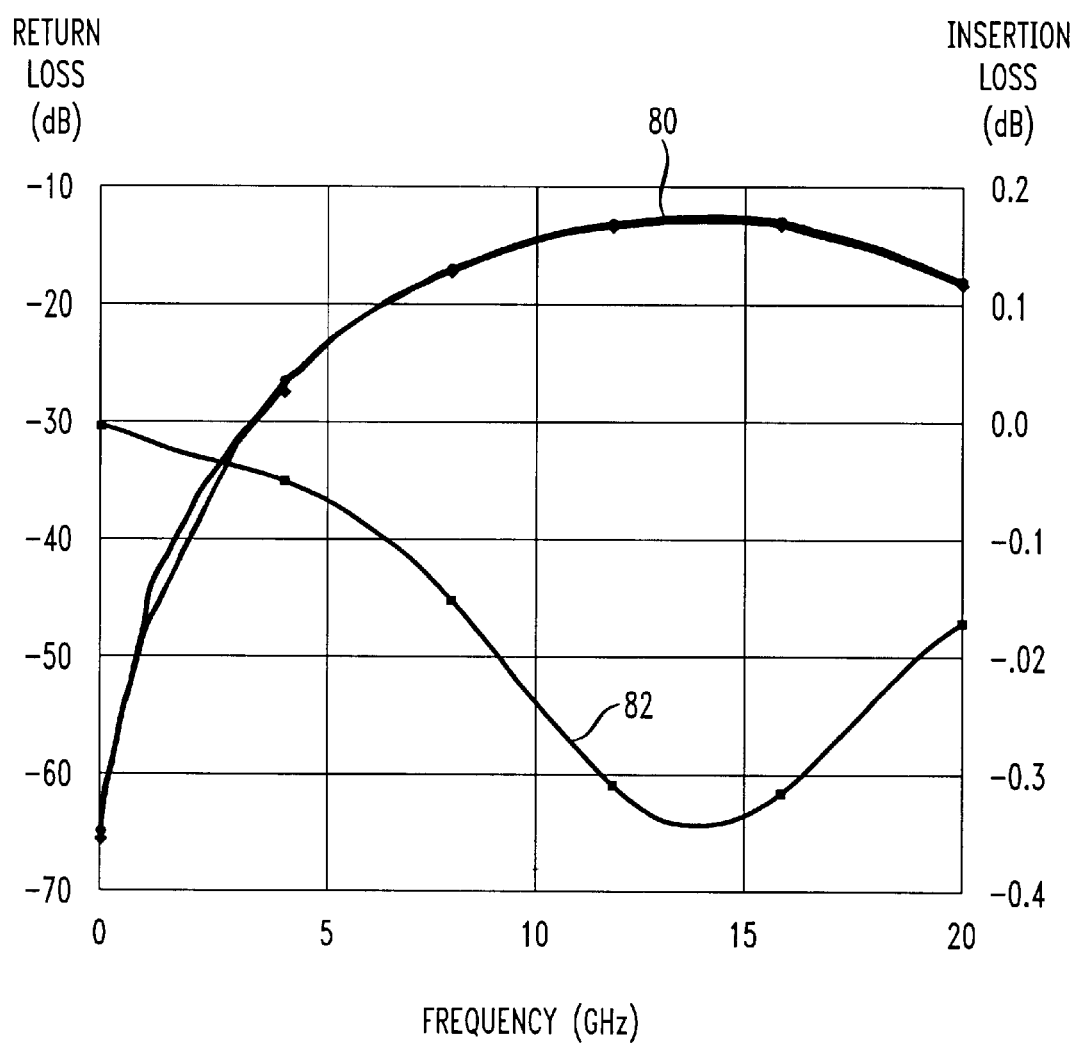
FIG. 6 is a plot showing the insertion loss and return loss calculated for an exemplary embodiment of the invention configured in differential mode.

FIG. 6 is a modeled (calculated) plot showing the insertion loss and return loss for an exemplary embodiment of the invention configured in differential mode. The scale on the left of the plot shown in FIG. 6 is the return loss scale, in dB. The scale on the right is the insertion loss scale in dB. Plotted curve 80 is return loss and plotted curve 82 is insertion loss. The scale at the bottom of the plot represents frequency increasing from left to right from 0.0 GHz to 20.0 GHz. For a differential configuration, insertion loss is measured by coupling an input signal to the segments of conductive strips 40 and 42 on surface area 48 (see FIG. 5A), and measuring the resultant transmitted signal at terminals 54 and 56. The insertion loss value at a particular frequency is equal to 20 times the log of the ratio of the resultant transmitted signal voltage over the input signal voltage. Return loss is measured by coupling an input signal to the segments of conductive strips 40 and 42 on surface area 48 and measuring the amplitude of the input signal that is reflected back to the same segments of conductive strips. The return loss value at a particular frequency is equal to 20 times the log of the ratio of the reflected signal voltage over the input signal voltage. Therefore, judging by the low value of return loss, the differential impedance is approximately 50 ohms (per conductive strip).

Figure 7:
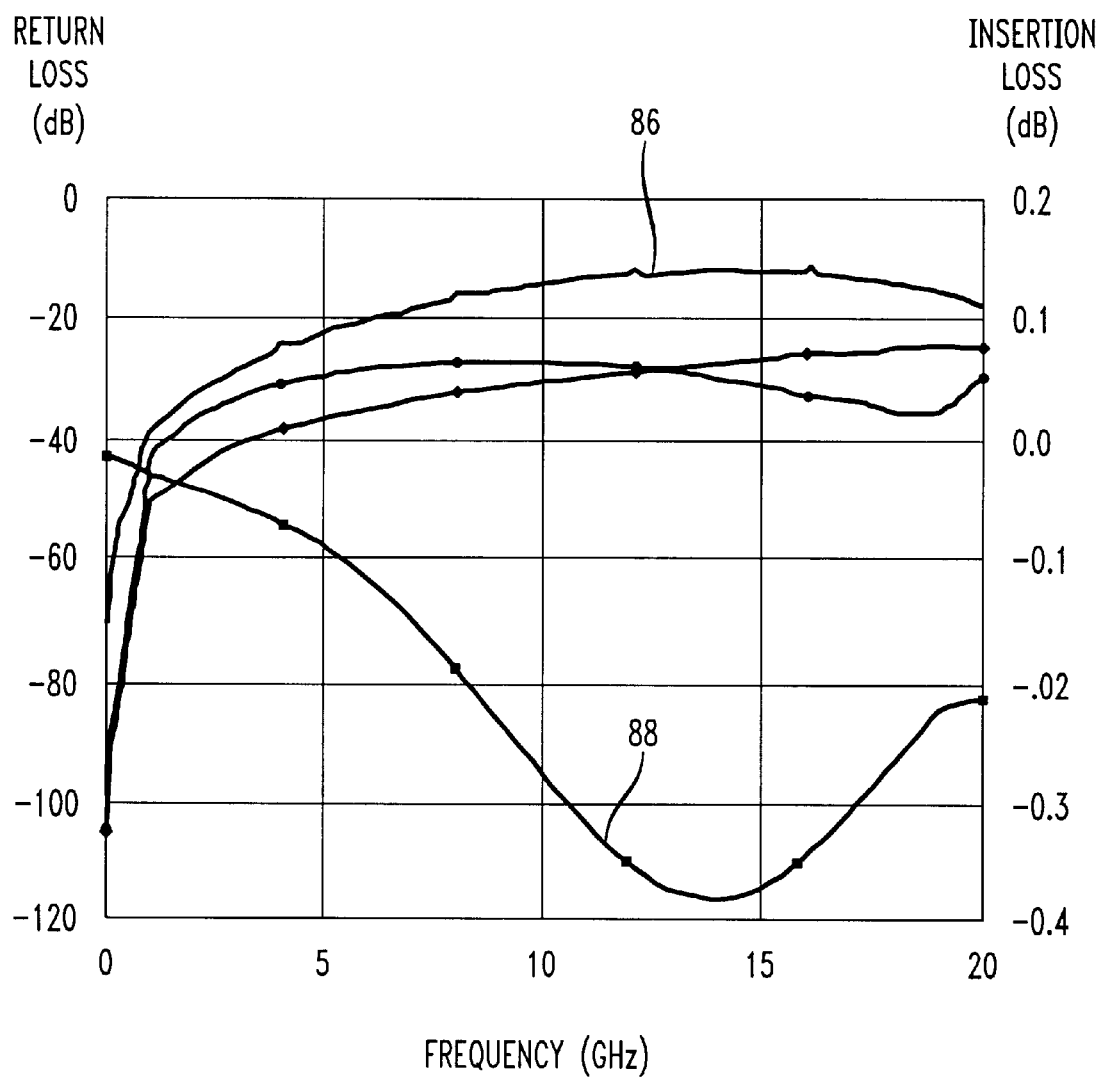
FIG. 7 is a plot showing the insertion loss and return loss calculated for an exemplary embodiment of the invention configured in single-ended mode.

FIG. 7 is a modeled (calculated) plot showing the insertion loss and return loss for an exemplary embodiment of the invention configured in single- ended mode. The scale on the left of the plot shown in FIG. 7 is the return loss scale, in dB. The scale on the right is the insertion loss scale in dB. Plotted curve 86 is return loss and plotted curve 88 is insertion loss. The scale at the bottom of the plot represents frequency increasing from left to right from 0.0 GHz to 20.0 GHz. For a single-ended configuration, insertion loss is measured by coupling an input signal to either the segment of conductive strip 40 on surface area 48 or the segment of conductive strip 42 on surface area 48 (see FIG. 5A), and either ground strip 36 or 38. The resultant transmitted signal is measured at terminals coupled to the corresponding conductive strips. For example, if an input signal were coupled to the segment of conductive strip 40 on surface area 48 and the segment of ground strip 36 on surface area 48, the resultant transmitted signal is measured at terminals 54 and 50. The insertion loss value at a particular frequency is equal to 20 times the log of the ratio of the resultant transmitted signal voltage over the input signal voltage. Return loss is measured by coupling an input signal to either the segment of conductive strip 40 on surface area 48 or the segment of conductive strip 42 on surface area 48, and either ground strip 36 or 38 on surface area 48, and measuring the amplitude of the input signal that is reflected back to the same segments of conductive strips. The return loss value at a particular frequency is equal to 20 times the log of the ratio of the reflected signal voltage over the input signal voltage. Therefore, judging by the low value of return loss, the inventors have observed the single-ended impedance to be approximately 50 ohms.

Figure 8A:
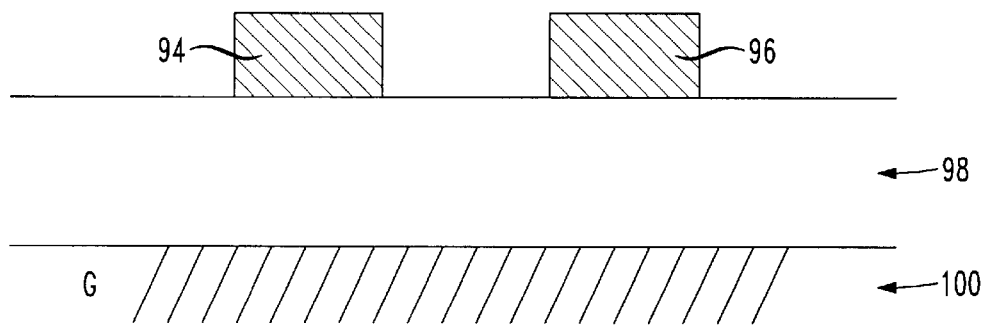
FIG. 8A is a diagram of an exemplary structure used to explain the characteristic impedance.

The inventors have used the single-ended and differential embodiments of the invention to explain characteristic impedances. FIG. 8A is a diagram of an exemplary structure used to explain characteristic impedance where the ground, G, can in addition, be located on the surface of 98. In FIG. 8A, conductive strips 94 and 96 represent S and $\overline{S}$. Conductive strips 94 and 96 are positioned on substrate 98. Substrate 98 is positioned between conductive strips 94 and 96, and ground 100. The structure depicted in FIG. 8A is used to explain characteristic impedances of the present invention.

Conductive strips 94 and 96 are coupled to each other and are supported by substrate 98, and are also coupled to ground through substrate 98. These couplings have associated capacitances. In the single-ended mode, the desired signal is obtained from either conductive strip 94 and ground, or conductive strip 96 and ground. Accordingly, the capacitance associated with a single-ended configuration is approximately the capacitance from the conductive strip to ground, Cg.

The differential configuration comprises two signal types (modes). These are the common mode signal (also referred to as the even mode signal), and the difference or differential mode signal (also referred to as the odd mode signal). The differential mode signal is typically the desired signal. The differential mode signal is the resultant signal obtained from the difference between S and $\overline{S}$. The common mode signal is typically an unwanted signal. The common mode signal is a signal which is common to both S and $\overline{S}$. It usually is caused by common interference, and typically is more prevalent the closer conductive strips 94 and 96 are positioned to each other. Thus typical differential configurations strive to maintain the differential mode signal and suppress the common mode signal. The capacitances associated with the differential mode are the odd mode capacitance, $C_{odd}$, and the capacitance to ground, Cg.

Figure 8B:
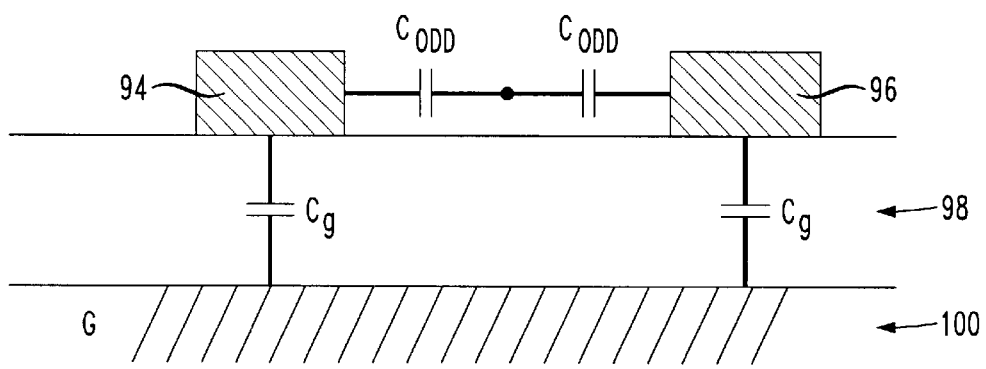
FIG. 8B is a diagram of an exemplary structure used to explain the characteristic impedance, illustrating odd mode capacitances.
Figure 8C:
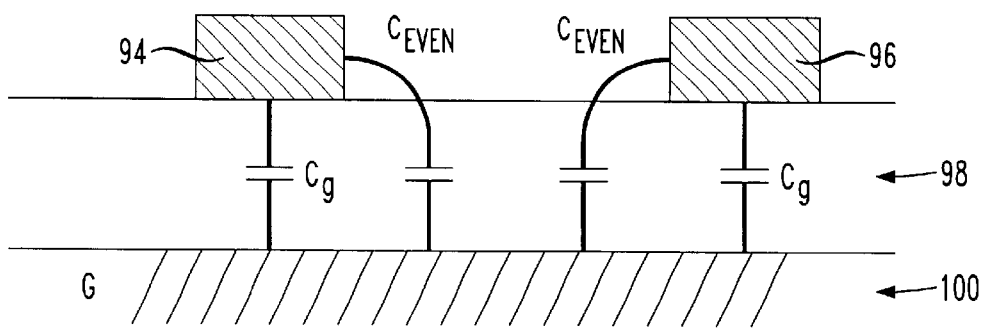
FIG. 8C is a diagram of an exemplary structure used to explain the characteristic impedance, illustrating even mode capacitances.

FIG. 8B is an exemplary structure used to explain characteristic impedance, illustrating odd mode capacitances. For the sake of simplicity, it is assumed that inductance changes insignificantly between the odd mode and the even mode. The capacitance between conductive strips 94 and 96 is represent by two capacitances in series of equal value, $C_{odd}$, and the capacitance to ground for each conductive strip is represented by Cg. For the odd mode, a virtual ground exists between the odd capacitors. FIG. 8C is an exemplary structure used to explain characteristic impedance, illustrating even mode capacitances. For the common mode signal (even mode) each conductive strip has two capacitances to ground, Cg and $C_{even}$. Thus, for the odd mode, the total capacitance per unit length for each conductive strip is equal to the sum of the odd mode capacitance and the capacitance to ground, as shown by equation (1).

$$C(\text{odd mode}) = Cg + C_{odd} \quad (1)$$

For the even mode, the total capacitance per unit length for each conductive strip is equal to the sum of the even mode capacitance and the capacitance to ground, as shown by equation (2).

$$C(\text{even mode}) = Cg + C_{even} \quad (2)$$

As is well known in the art, characteristic impedance, Zo, is obtained by the following equation.

$$Zo = \sqrt{\frac{L}{C}} \quad (3)$$

Therefore, $$Zo \text{ (odd mode)} = \sqrt{\frac{L}{C}} = \frac{\sqrt{L}}{\sqrt{Cg + C_{odd}}} \quad (4)$$

and, $$Zo \text{ (even mode)} = \sqrt{\frac{L}{C}} = \frac{\sqrt{L}}{\sqrt{Cg + C_{even}}} \quad (5)$$

The inventors have designed package 12, such that $C_{odd}$ is much less than Cg, and $C_{even}$ is also much less than Cg. In equation form:

$$C_{odd} \ll Cg \text{ and } C_{even} \ll Cg \quad (6)$$

Accordingly;

$$Zo \text{ for each conductive strip (odd mode)} \approx \sqrt{\frac{L}{Cg}}, \text{ and} \quad (7)$$

$$Zo \text{ for each conductive strip (even mode)} \approx \sqrt{\frac{L}{Cg}} \quad (8)$$

For a single-ended configuration, $$Z0 = \sqrt{\frac{L}{Cg}} \quad (9)$$

Therefore, for each conductive strip, Z0 (odd mode)≈Zo (even mode)≈(single-ended), when $C_{odd} \ll Cg$ and $C_{even} \ll Cg$. Thus, by designing package 12 in accordance with present invention, package 12 may be used in a single-ended configuration or a differential configuration, and provide a characteristic impedance of approximately 50 ohms.

Figure 9:
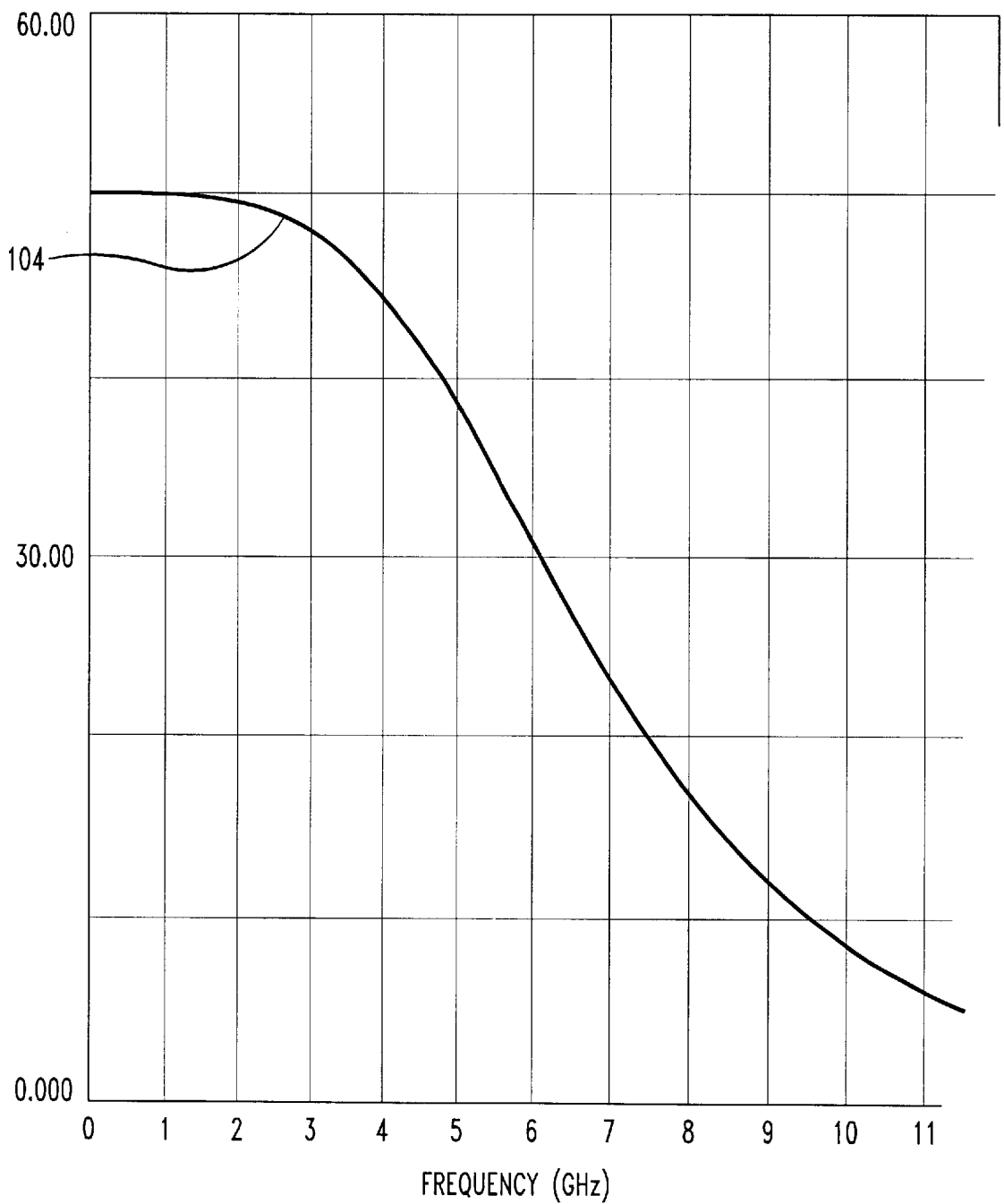
FIG. 9 is a plot of the real part of the characteristic impedance as a function of frequency for an exemplary embodiment of the present invention in a single-ended configuration.

FIG. 9 is a modeled (calculated) plot of the real part of the characteristic impedance as a function of frequency for an exemplary embodiment of the present invention in a single-ended configuration. The scale at the bottom of the plot in FIG. 9 is frequency ranging from 0 GHz on the left to 11 GHz on the right. The scale on the left is the real part of the characteristic impedance, Zo, in ohms. The plotted curve 104 shows that the real part of Zo is approximately 50 ohms at 0 GHz and decreases as frequency increases.

Figure 10:
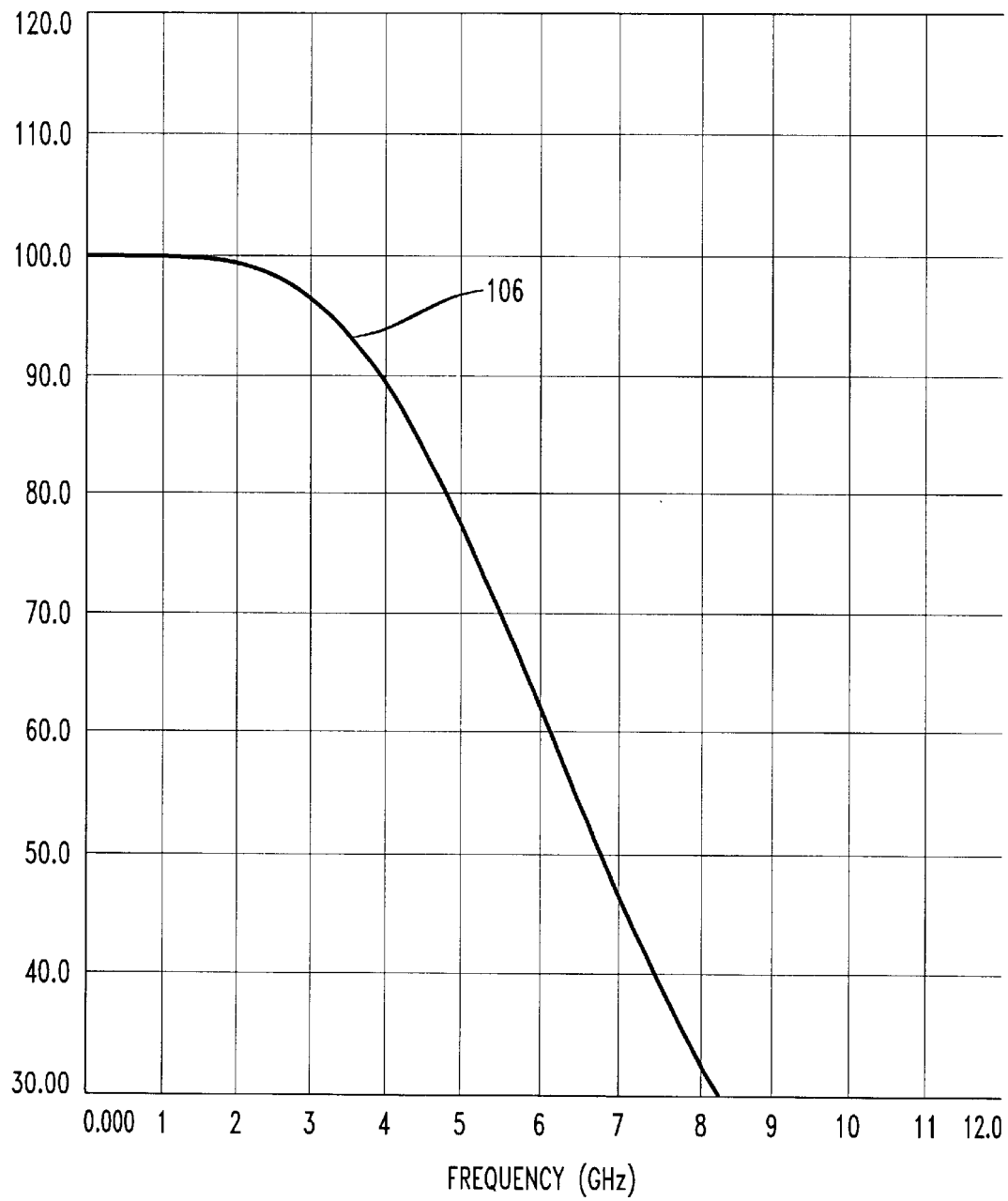
FIG. 10 is a plot of the real part of the total characteristic impedance as a function of frequency for an exemplary embodiment of the present invention in a differential configuration.

FIG. 10 is a plot of the real part of the characteristic impedance as a function of frequency for an exemplary embodiment of the present invention in a differential configuration. The scale at the bottom of the plot in FIG. 10 is frequency ranging from 0 GHz on the left to 11 GHz on the right. The scale on the left is the real part of the characteristic impedance, Zo, in ohms. The plotted curve 106 shows that the real part of Zo between the two conductive strips is approximately 100 ohms (i.e., 2×50 ohms for each conductive strip) at 0 GHz and decreases and frequency increases.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. An electronic package adapted to be coupled in a single-ended configuration and in a differential configuration, said electronic package comprising two adjacent terminals adapted to be coupled to a first signal and a second signal, respectively, wherein said package provides a characteristic impedance of approximately 50 ohms when said package is configured in a single-ended configuration, and said package provides a characteristic impedance of approximately 50 ohms when said package is configured in a differential configuration.

2. An electronic package in accordance with claim 1, wherein said electronic package comprises:
   a first terminal adapted to be coupled to ground;
   a second terminal adapted to be coupled to said first signal;
   a third terminal adapted to be coupled to said second signal, wherein said first signal is 180 degrees out of phase with said second signal; and
   a fourth terminal adapted to be coupled to ground.

3. An electronic package in accordance with claim 2, wherein said differential configuration is provided by electromagnetically coupling said second terminal and said third terminal to said first signal and said second signal, respectively.

4. An electronic package in accordance with claim 2, wherein said single-ended configuration is provided by electromagnetically coupling one of:
  (a) said second terminal to said first signal, and said first terminal to ground;
  (b) said third terminal to said first signal, and said fourth terminal to ground;
  (c) said second terminal to said first signal, and said first and fourth terminals to ground; and
  (d) said third terminal to said first signal, and said first and fourth terminals to ground.

5. An electronic package in accordance with claim 4, wherein said second terminal is electromagnetically coupled to said first terminal by a termination impedance when said third terminal is electromagnetically coupled to said first signal; and said fourth terminal is electromagnetically coupled to ground.

6. An electronic package in accordance with claim 5, wherein said termination impedance is approximately 50 ohms.

7. An electronic package in accordance with claim 4, wherein said third terminal is electromagnetically coupled to said fourth terminal by a termination impedance when said second terminal is electromagnetically coupled to said first signal and said first terminal is electromagnetically coupled to ground.

8. An electronic package in accordance with claim 7, wherein said termination impedance is approximately 50 ohms.

9. An electronic package in accordance with claim 2 further comprising:
  a coupling circuit electromagnetically coupled to said first, second, third, and fourth terminals;
  a plurality of transmission lines electromagnetically coupled to said coupling circuit;
  an integrated circuit portion electromagnetically coupled to said plurality of transmission lines; and
  an optical circuit electromagnetically coupled to said integrated circuit portion, wherein said optical circuit is adapted to be optically coupled to an optical signal.

10. An electronic package in accordance with claim 9, wherein said coupling circuit comprises:
  a substrate having an upper surface;
  an upper layer in contact with a portion of said upper surface of said substrate; and
  a plurality of conductive strips positioned on said upper surface of said substrate; a segment of each conductive strip being positioned between said upper layer and said substrate.

11. An electronic package in accordance with claim 10, wherein said upper layer and said substrate comprise alumina.

12. An electronic package in accordance with claim 10, wherein said plurality of conductive strips comprises:
  a first conductive strip having a first, a second, and a third segment, said first segment of said first conductive strip being electromagnetically coupled to said first terminal, said second segment of said first conductive strip being positioned between said upper layer and said substrate, and said third segment of said first conductive strip being electromagnetically coupled to said plurality of transmission lines;
  a second conductive strip having a first, a second, and a third segment, said first segment of said second conductive strip being electromagnetically coupled to said second terminal, said second segment of said second conductive strip being positioned between said upper layer and said substrate, and said third segment of said second conductive strip being electromagnetically coupled to said plurality of transmission lines;
  a third conductive strip having a first, a second, and a third segment, said first segment of said third conductive strip being electromagnetically coupled to said third terminal, said second segment of said third conductive strip being positioned between said upper layer and said substrate, and said third segment of said third conductive strip being electromagnetically coupled to said plurality of transmission lines; and
  a fourth conductive strip having a first, a second, and a third segment, said first segment of said fourth conductive strip being electromagnetically coupled to said fourth terminal, said second segment of said fourth conductive strip being positioned between said upper layer and said substrate, and said third segment of said fourth conductive strip being electromagnetically coupled to said plurality of transmission lines.

13. An electronic package in accordance with claim 12, wherein:
  each segment of said first conductive strip is approximately 0.55 mm wide;
  each segment of said fourth conductive strip is approximately 0.55 mm wide;
  said third segment of said second and third conductive strips is each approximately 0.20 mm wide;
  said first segment of said second and third conductive strips is each approximately 0.30 mm wide;
  said second segment of said second and third conductive strips is each approximately 0.10 mm wide;
  said substrate is approximately 3.87 mm long and 0.254 mm high; and
  said upper layer is approximately 1.52 mm long and 2.54 mm high.

14. An electronic package in accordance with claim 12, wherein:
  a spacing between opposing edges of said first segment of said second conductive strip and said first segment of said third conductive strip is approximately 0.64 mm;
  a spacing between opposing edges of said second segment of said second conductive strip and said second segment of said third conductive strip is approximately 0.64 mm;
  a spacing between opposing edges of said third segment of said second conductive strip and said third segment of said third conductive strip is approximately 0.44 mm;
  a spacing between said centerline of said first conductive strip and a centerline of said fourth conductive strip is approximately 3.18 mm;
  a spacing between a centerline of said third segment of said third conductive strip and a outer edge of said substrate is approximately 1.9 mm; and
  a spacing between a centerline of said fourth conductive strip and said outer edge of said substrate is approximately 0.62 mm.

* * * * *